United States Patent
Lai et al.

(10) Patent No.: US 6,828,255 B2
(45) Date of Patent: Dec. 7, 2004

(54) CRACK INHIBITED COMPOSITE DIELECTRIC LAYER

(75) Inventors: Ching-Lun Lai, Taichung (TW); Shi-Wei Wang, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 147 days.

(21) Appl. No.: 10/302,394

(22) Filed: Nov. 22, 2002

(65) Prior Publication Data

US 2004/0102055 A1 May 27, 2004

(51) Int. Cl.⁷ .................... H01L 21/31; H01L 21/469
(52) U.S. Cl. .................... 438/761; 438/778
(58) Field of Search ............... 438/761, 778, 438/787, FOR 395, FOR 403

(56) References Cited

U.S. PATENT DOCUMENTS

| | | | |
|---|---|---|---|
| 5,976,993 A | | 11/1999 | Ravi et al. |
| 6,165,915 A | * | 12/2000 | Jang ............... 438/787 |
| 6,372,664 B1 | | 4/2002 | Jang et al. |
| 6,410,457 B1 | * | 6/2002 | M'Saad et al. ........ 438/778 |
| 6,500,771 B1 | * | 12/2002 | Vassiliev et al. ...... 438/783 |
| 6,583,069 B1 | * | 6/2003 | Vassiliev et al. ...... 438/778 |
| 2001/0001678 A1 | * | 5/2001 | Tsai et al. ............. 427/58 |
| 2001/0016419 A1 | * | 8/2001 | Huang ................. 438/687 |
| 2001/0019883 A1 | * | 9/2001 | Liu et al. ............. 438/631 |

FOREIGN PATENT DOCUMENTS

| | | | | | |
|---|---|---|---|---|---|
| JP | 2001135592 A | * | 5/2001 | ..... | H01L/21/28 |
| KR | 2001017242 A | * | 3/2001 | ..... | H01L/21/31 |
| KR | 365753 B | * | 12/2002 | ..... | H01L/21/283 |

* cited by examiner

*Primary Examiner*—George Fourson
*Assistant Examiner*—Michelle Estrada
(74) *Attorney, Agent, or Firm*—Tung & Associates

(57) ABSTRACT

A method for forming a composite dielectric layer within a microelectronic product provides a first dielectric layer formed over a substrate of a fluorosilicate glass (FSG) dielectric material deposited employing a high density plasma chemical vapor deposition (HDP-CVD) method. The method also provides a second dielectric layer formed over the first dielectric layer and formed of an undoped silicate glass (USG) dielectric material deposited employing a HDP-CVD source radio frequency power only method employing a source radio frequency power of from about 1000 to about 5000 watts absent a bias power. The composite dielectric layer is formed with inhibited cracking.

18 Claims, 1 Drawing Sheet

CRACK INHIBITED COMPOSITE DIELECTRIC LAYER

BACKGROUND OF THE INVENTION

1. Field of the Invention

The present invention relates generally to methods for fabricating microelectronic products. More particularly, the present invention relates to methods for forming dielectric layers within microelectronic products.

2. Description of the Related Art

Microelectronic fabrications are formed from microelectronic substrates over which are formed patterned conductor layers which are separated by dielectric layers.

As microelectronic product integration levels have increased and patterned conductor layer dimensions have decreased, it has become increasingly difficult to form within microelectronic products dielectric layers formed with inhibited cracking. Cracking within dielectric layers is often attributable to physical stress within dielectric layers. In turn, physical stress is often amplified as microelectronic structure dimensions decrease.

It is thus desirable in the art of microelectronic fabrication to fabricate microelectronic products with inhibited dielectric layer cracking. It is towards the foregoing object that the present invention is directed.

Various methods have been disclosed in the microelectronic fabrication art for forming microelectronic products with desirable properties.

Included but not limiting among the methods are methods disclosed within: (1) Ravi et al., in U.S. Pat. No. 5,976,993 (a laminated layer method for reducing intrinsic stress within a high density plasma chemical vapor deposition (HDP-CVD) deposited dielectric layer); and (2) Jang et al., in U.S. Pat. No. 6,372,664 (an additional laminated layer method for inhibiting cracking within a dielectric layer formed in part employing an HDP-CVD method).

Desirable in the microelectronic fabrication art are additional methods for forming dielectric layers with inhibited cracking.

It is towards the foregoing object that the present invention is directed.

SUMMARY OF THE INVENTION

A first object of the invention is to provide a method for forming a dielectric layer within a microelectronic product.

A second object of the invention is to provide a method in accord with the first object, wherein the dielectric layer is formed with inhibited cracking.

In accord with the objects of the invention, the present invention provides a method for forming a microelectronic product.

To practice the method of the invention, there is first provided a substrate having formed thereover a tensile stressed topographic feature. There is then formed over the substrate including the tensile stressed topographic feature a first dielectric layer formed of a fluorosilicate glass (FSG) dielectric material formed employing a high density plasma chemical vapor deposition (HDP-CVD) method. There is then formed over the first dielectric layer a second dielectric layer formed of an undoped silicate glass (USG) dielectric material formed employing an HPD-CVD source radio frequency power only method employing a radio frequency source power of from about 1000 to about 5000 watts absent a bias power.

The present invention provides a method for forming a dielectric layer within a microelectronic product, wherein the dielectric layer is formed with attenuated cracking.

The present invention realizes the foregoing object within the context of an FSG/USG laminate by employing a specific radio frequency source power (and absent a bias power) within an HDP-CVD source radio frequency power only method employed in part for forming the FSG/USG laminate.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming a dielectric layer within a microelectronic product, wherein the dielectric layer is formed with attenuated cracking.

The present invention realizes the foregoing object within the context of an FSG/USG laminate by employing a specific radio frequency source power (absent a bias power) within an HDP-CVD source radio frequency power only method employed in part for forming the FSG/USG laminate.

Figure 1:
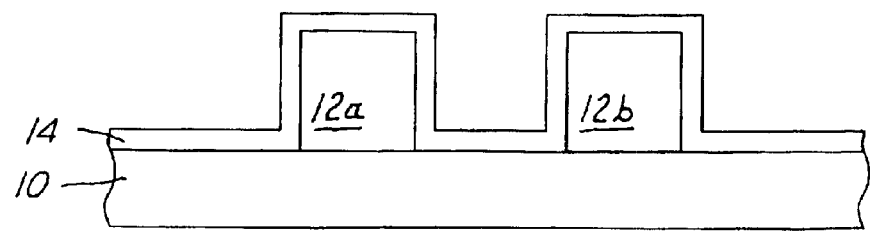
FIG. 1, FIG. 2, FIG. 3 and FIG. 4 show a series of schematic cross-sectional diagrams illustrating the results of progressive stages of forming a microelectronic product in accord with the present invention.

FIG. 1 to FIG. 4 show a series of schematic cross-sectional diagrams illustrating the results of progressive stages of forming a microelectronic product in accord with the present invention. FIG. 1 shows a schematic cross-sectional diagram of the microelectronic product at an early stage in its fabrication.

FIG. 1 shows a substrate 10 having formed thereupon a pair of topographic features 12a and 12b. FIG. 1 also illustrates an optional blanket conformal liner layer 14 formed upon exposed surfaces of the substrate 10 and the pair of topographic features 12a and 12b.

Within the invention, the substrate 10 may be employed within a microelectronic product selected from the group including but not limited to of integrated circuit products (including semiconductor products), ceramic substrate products and optoelectronic products. Although not specifically illustrated within FIG. 1, the substrate 10 may consist of a substrate alone as employed within the microelectronic product. In the alternative, the substrate 10 may comprise a substrate as employed within the microelectronic product, where the substrate has formed thereupon and/or thereover additional layers as are conventional within the microelectronic product. Similarly with the substrate alone, such additional layers may be formed from materials selected from the group including but not limited to conductor materials, semiconductor materials and dielectric materials. More preferably, the substrate 10 comprises a semiconductor substrate employed within a semiconductor product, where the semiconductor substrate has formed thereover additional layers and structures which in turn form semiconductor devices.

Within the invention, the pair of topographic features 12a and 12b is highly tensilely stressed and is typically formed of a conductor material such as but not limited to a metal or metal alloy conductor material. Typical metal and metal alloy conductor materials may include, but are not limited to aluminum, aluminum alloy, copper and copper alloy conductor materials. Typically each of the topographic features 12a and 12b is formed to a thickness of from about 3000 to about 9000 angstroms and a linewidth of from about 0.1 to about 30 microns. Typically, each of the topographic features 12a and 12b is tensile stressed to a level of from about 1.0E9 to about 1.0E10 dyne/cm$^2$.

Within the invention, the optional blanket conformal liner layer 14 is typically formed of a dielectric material such as but not limited to a silicon oxide, silicon nitride or silicon oxynitride dielectric material, formed to a thickness of from about 100 to about 1000 angstroms. The optional blanket conformal liner layer 14 may be formed employing methods as are conventional in the art of microelectronic fabrication, including but not limited to chemical vapor deposition (CVD) methods.

Figure 2:
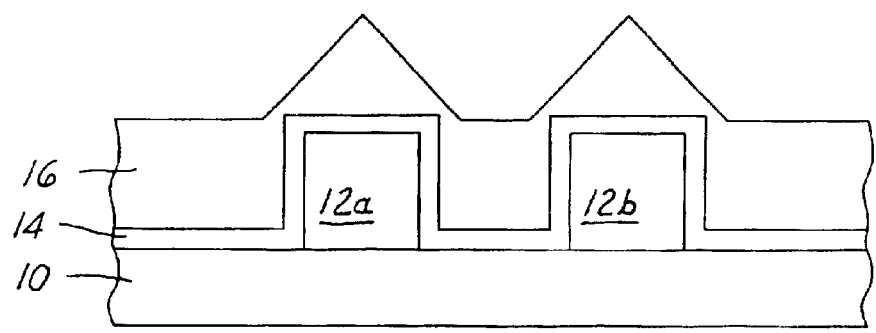

FIG. 2 illustrates the results of further processing of the microelectronic product of FIG. 1.

FIG. 2 shows a blanket gap filling dielectric layer 16 formed upon the blanket conformal liner layer 14.

Within the invention, the blanket gap filling dielectric layer 16 is formed of an FSG dielectric material deposited employing an HDP-CVD method. The HDP-CVD method employs silane, oxygen and silicon tetrafluoride source materials, as well as an argon sputtering gas component. The HDP-CVD method also employs with respect to at least 200 mm and 300 mm diameter substrates: (1) a reactor chamber pressure of from about 2 to about 20 mtorr; (2) a radio frequency source power of from about 1000 to about 4000 watts and a bias power of from about 500 to about 4000 watts; (3) a substrate temperature of from about 250 to about 450 degrees centigrade; (4) a silane flow rate of about 30 to about 100 standard cubic centimeters per minute (sccm); (5) an oxygen flow rate of about 50 to about 500 sccm; (6) a silicon tetrafluoride flow rate of about 5 to about 50 sccm; and (7) an argon flow rate of from about 10 to about 100 sccm. Typically, the blanket gap filling dielectric layer 16 is formed to a thickness of from about 4000 to about 8000 angstroms with the characteristic pointed protrusions over the pair of topographic features 12a and 12b. Typically, the blanket gap filling dielectric layer 16 is formed with a compressive stress of from about −1.0E8 to about −1.2E9 dyne/cm$^2$.

Figure 3:
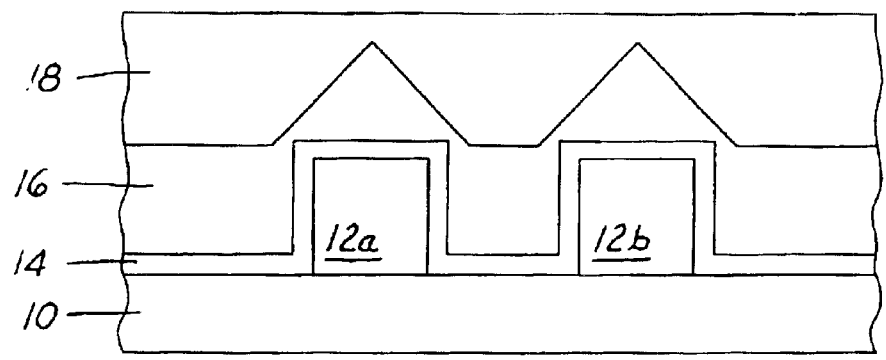

FIG. 3 shows the results of further processing of the microelectronic product of FIG. 2.

FIG. 3 shows the results of forming an optional blanket planarized dielectric layer 18 upon the blanket gap filling dielectric layer 16.

Within the invention, the optional blanket planarized dielectric layer 18 is formed of an FSG dielectric material deposited employing a PECVD method employing a source radio frequency power of from about 300 to about 3000 watts, absent a bias power. Typically, the PECVD method also employs: (1) a reactor chamber pressure of from about 0.5 to about 20 torr; (2) a substrate temperature of from about 250 to about 450 degrees centigrade; (3) a silane flow rate of from about 50 to about 500 sccm; (4) a nitrous oxide flow rate of from about 500 to about 20000 sccm; and (5) a silicon tetrafluoride flow rate of about 20 to about 1000 sccm. Typically, the blanket planarized dielectric layer 18 formed to a thickness of from about 8000 to about 13000 angstroms and then planarized to a thickness of from about 3000 to about 8000 angstroms (as measured from the base of each of the pair of topographic features 12a and 12b). Typically, the blanket planarized dielectric layer 18 has a compressive stress of from about −1.0E9 to about −2.0E9 dyne/cm$^2$.

Figure 4:
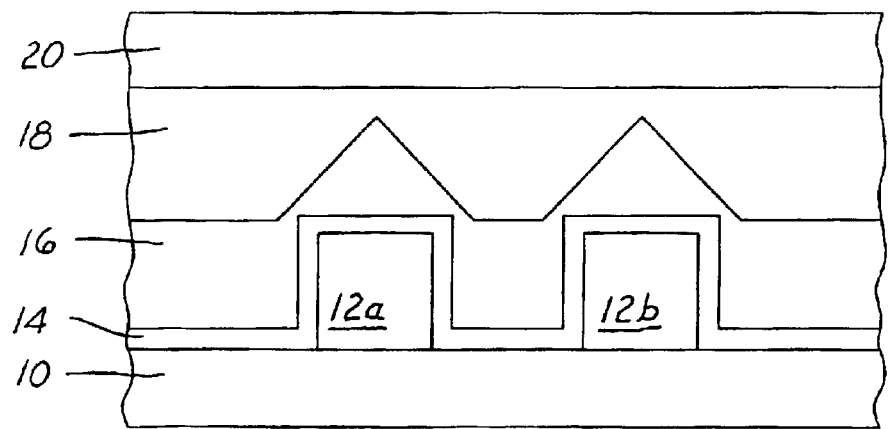

FIG. 4 shows the results of further processing of the microelectronic product of FIG. 3.

FIG. 4 shows the results of forming a blanket capping dielectric layer 20 upon the blanket second dielectric layer 18.

Within the invention, the blanket capping dielectric layer 20 is formed of a USG dielectric material deposited employing an HDP-CVD method employing a source radio frequency only and no bias power (i.e., an HDP-CVD source radio frequency power only method) having a radio frequency source power of from about 1000 to about 5000 watts (more preferably from about 2500 to about 4500 watts and most preferably from about 4000 to about 4500 watts). The HDP-CVD source radio frequency power only method also employs: (1) a reactor chamber pressure of from about 1 to about 20 mtorr; (2) a substrate temperature of from about 250 to about 450 degrees centigrade; (3) a silane flow rate of from about 20 to about 100 sccm; (4) an oxygen flow rate of from about 30 to about 300 sccm. Typically, the blanket capping dielectric layer 20 is formed to a thickness of from about 1000 to about 3000 angstroms. Typically, the blanket capping dielectric layer 20 is formed with a compressive stress of from about −3.0E9 to about −5.0E9 dyne/cm$^2$, which is much higher than a compressive stress of a blanket capping dielectric layer formed employing a traditional PECVD method which yields a compressive stress of from about −1.0E9 to about −2.0E9.

FIG. 4 illustrates a microelectronic product fabricated in accord with the preferred embodiment of the invention. The microelectronic product has formed therein over a tensilely stressed topographic feature a laminated dielectric layer with inhibited susceptibility to cracking. The laminated dielectric layer comprises: (1) a gap filling dielectric layer formed of an FSG dielectric material formed employing an HDP-CVD method; (2) an optional planarized dielectric layer formed upon the gap filling dielectric layer and formed of an FSG dielectric material formed employing a PECVD method employing a radio frequency source power of from about 300 to about 3000 watts absent a bias power; and (3) a capping dielectric layer formed upon the planarized dielectric layer and formed of a USG dielectric material formed employing an HDP-CVD source radio frequency power only method employing a source radio frequency power of from about 1000 to about 5000 watts absent a bias power, to thus provide a particularly high compressive stress within the USG dielectric material.

Although not specifically illustrated within the schematic diagrams of FIG. 1 to FIG. 4, the microelectronic product in accord with the preferred embodiment of the invention may be sequentially fabricated within a single HDP-CVD reactor chamber such as to provide for enhanced manufacturing efficiency. In addition, a USG capping dielectric layer formed in accord with the present invention has a generally higher dielectric constant of about 1.477, indicative of superior barrier properties with respect to free fluorine inhibition due to the presence of increased levels of silicon dangling bonds which might sequester free fluorine. Finally, within the invention, it is generally desired to approximately equalize (i.e., within about +/−20 percent) a sum of stresses of tensile stressed layers with respect to a sum of stresses of compressive stressed layers within a microelectronic product.

EXAMPLES

In order to illustrate the value of the invention, several types of conductor and dielectric layers were formed over a series of 200 mm semiconductor substrates.

First, a blanket 2 percent copper in aluminum alloy layer was formed over a semiconductor substrate at a thickness of about 5000 angstroms while employing a physical vapor deposition (PVD) sputtering method.

Second, a blanket FSG layer was formed upon a semiconductor substrate at a thickness of about 6500 angstroms while employing an HDP-CVD method. The HDP-CVD method also employed: (1) a reactor chamber pressure of about 5 mtorr; (2) a radio frequency source power of about 4200 watts and a bias power of about 3000 watts; (3) a semiconductor substrate temperature of about 420 degrees centigrade; (4) a silane flow rate of about 40 sccm; (5) an oxygen flow rate of about 100 sccm; (6) a silicon tetrafluoride flow rate of about 30 sccm; and (7) a argon flow rate of about 40 sccm.

Third, a blanket FSG layer was formed over a semiconductor substrate at a thickness of about 11000 angstroms while employing a PECVD method. The PECVD method also employed: (1) a reactor chamber pressure of about 1.5 torr; (2) a radio frequency source power of about 2300 watts absent a bias power; (3) a semiconductor substrate temperature of about 400 degrees centigrade; (4) a silane flow rate of about 300 sccm; (5) a nitrous oxide flow rate of about 10000 sccm; and (5) a silicon tetrafluoride flow rate of about 750 sccm.

Finally, a blanket USG layer was formed over a semiconductor substrate at a thickness of about 2000 angstroms while employing an HDP-CVD source radio frequency only method. The HDP-CVD source radio frequency only method also employed: (1) a reactor chamber pressure of about 5 mtorr; (2) a radio frequency source power of about 4400 watts absent a bias power; (3) a semiconductor substrate temperature of about 350 degrees centigrade; (4) a silane flow rate of about 50 sccm; and (5) an oxygen flow rate of about 120 sccm.

Physical stresses for each of the foregoing layers were determined employing semiconductor substrate deflection methods as are conventional in the art of microelectronic fabrication. Results of the measurements are reported in Table I, where positive values represent tensile stresses and negative values represent compressive stresses.

TABLE I

| Layer | Stress |
| --- | --- |
| Al/Cu Alloy | +4E9 |
| HDP-CVD FSG | −8E8 |
| PECVD FSG | −1.5E9 |
| HDP-CVD source only USG | −4E9 |

As is seen from review of the data in Table I, an HDC-CVD source radio frequency power only USG layer formed in accord with the present invention has a particularly high compressive stress which presumably compensates effectively for the particularly high tensile stress within an aluminum copper alloy layer when forming a microelectronic product in accord with the preferred embodiment of the present invention.

The preferred embodiment and example of the invention are illustrative of the invention rather than limiting of the invention. Revisions and modifications may be made to structures and dimensions in accord with the preferred embodiment and example of the invention while still fabricating a microelectronic fabrication in accord with the present invention, further in accord with the accompanying claims.

What is claimed is:

1. A method for forming a microelectronic product comprising:

providing a substrate having formed thereover a tensile stressed topographic feature;

forming over the substrate including the tensile stressed topographic feature a first dielectric layer formed of a fluorosilicate glass dielectric material formed employing a high density plasma chemical vapor deposition method; and forming over the first dielectric layer a second dielectric layer formed of an undoped silicate glass dielectric material formed employing a high density plasma chemical vapor deposition source radio frequency power only method and employing a source radio frequency power of from about 1000 to about 5000 watts.

2. The method of claim 1 further comprising forming interposed between the first dielectric layer and the second dielectric layer a third dielectric layer formed of a fluorosilicate glass dielectric material formed employing a plasma enhanced chemical vapor deposition method employing a source radio frequency power of from about 300 to about 3000 watts absent a bias power.

3. The method of claim 1 wherein the substrate is employed within a microelectronic product selected from the group consisting of integrated circuit products, ceramic substrate products and optoelectronic products.

4. The method of claim 1 wherein the tensile stressed topographic feature has a tensile stress of from about 1.0E9 to about 1.0E10 dyne/cm$^2$.

5. The method of claim 1 wherein the tensile stressed topographic feature is a patterned conductor layer.

6. The method of claim 1 wherein the second dielectric layer has a thickness of from about 1000 to about 3000 angstroms.

7. A method for forming a semiconductor product comprising:

providing a semiconductor substrate having formed thereover a tensile stressed topographic feature;

forming over the semiconductor substrate including the tensile stressed topographic feature a first dielectric layer formed of a fluorosilicate glass dielectric material formed employing a high density plasma chemical vapor deposition method; and forming over the first dielectric layer a second dielectric layer formed of an undoped silicate glass dielectric material formed employing a high density plasma chemical vapor deposition source radio frequency power only method employing a source radio frequency power of from about 1000 to about 5000 watts.

8. The method of claim 7 further comprising forming interposed between the first dielectric layer and the second dielectric layer a third dielectric layer formed of a fluorosilicate glass dielectric material formed employing a plasma enhanced chemical vapor deposition method employing a source radio frequency power of from about 300 to about 3000 watts absent a bias power.

9. The method of claim 7 wherein the tensile stressed topographic feature has a tensile stress of from about 1.0E9 to about 1.0E10 dyne/cm$^2$.

10. The method of claim 7 wherein the tensile stressed topographic feature is a patterned conductor layer.

11. The method of claim 7 wherein the second dielectric layer has a thickness of from about 1000 to about 3000 angstroms.

12. A method for forming a microelectronic product comprising:

providing a substrate having formed thereover a tensile stressed topographic feature;

forming over the substrate including the tensile stressed topographic feature a first dielectric layer formed of a fluorosilicate glass dielectric material formed employing a high density plasma chemical vapor deposition method and having a compressive stress; and forming over the first dielectric layer a second dielectric layer formed of an undoped silicate glass dielectric material formed employing a high density plasma chemical vapor deposition source radio frequency power only method employing a source radio frequency power of from about 1000 to about 5000 watts and having a compressive stress, wherein a total of tensile stress within the microelectronic product approximately equals a sum of compressive stress within the microelectronic product.

13. The method of claim 12 further comprising forming interposed between the first dielectric layer and the second dielectric layer a third dielectric layer formed of a fluorosilicate glass dielectric material formed employing a plasma enhanced chemical vapor deposition method employing a source radio frequency power of from about 300 to about 3000 watts absent a bias power.

14. The method of claim 12 wherein the substrate is employed within a microelectronic product selected from the group consisting of integrated circuit products, ceramic substrate products and optoelectronic products.

15. The method of claim 12 wherein the tensile stressed topographic feature has a tensile stress of from about 1.0E9 to about 1.0E10 dyne/cm$^2$.

16. The method of claim 12 wherein the tensile stressed topographic feature is a patterned conductor layer.

17. The method of claim 12 wherein the second dielectric layer has a thickness of from about 1000 to about 3000 angstroms.

18. The method of claim 13 wherein;

the first dielectric layer has a compressive stress of from about −1.0E8 to about −1.2E9 dyne/cm$^2$;

the second dielectric layer has a compressive stress of from about −3.0E9 to about −5.0E9 dyne/cm$^2$; and the third dielectric layer has a compressive stress of from about −1.0E9 to about −2.0E9 dyne/cm$^2$.

\* \* \* \* \*